United States Patent
Kawasaki et al.

(10) Patent No.: US 9,561,608 B2
(45) Date of Patent: Feb. 7, 2017

(54) SENSOR UNIT

(71) Applicant: AISIN SEIKI KABUSHIKI KAISHA, Kariya-shi, Aichi (JP)

(72) Inventors: Koji Kawasaki, Kariya (JP); Kazuhiro Adachi, Chita-gun (JP); Kyoichi Okamura, Nagoya (JP)

(73) Assignee: AISIN SEIKI KABUSHIKI KAISHA, Aichi (JP)

( * ) Notice: Subject to any disclaimer, the term of this patent is extended or adjusted under 35 U.S.C. 154(b) by 63 days.

(21) Appl. No.: 14/425,365

(22) PCT Filed: Sep. 25, 2013

(86) PCT No.: PCT/JP2013/075839
§ 371 (c)(1),
(2) Date: Mar. 3, 2015

(87) PCT Pub. No.: WO2014/054481
PCT Pub. Date: Apr. 10, 2014

(65) Prior Publication Data
US 2015/0217495 A1  Aug. 6, 2015

(30) Foreign Application Priority Data
Oct. 3, 2012 (JP) .................................. 2012-221585

(51) Int. Cl.
*G01P 3/44* (2006.01)
*G01D 5/14* (2006.01)
(Continued)

(52) U.S. Cl.
CPC ... *B29C 45/14065* (2013.01); *B29C 45/14336* (2013.01); *B29C 45/14344* (2013.01);
(Continued)

(58) Field of Classification Search
CPC .............. G01P 3/487; G01P 3/443; G01P 3/44
See application file for complete search history.

(56) References Cited

U.S. PATENT DOCUMENTS 4,002,937 A * 1/1977 Anson .................... H02K 1/272
310/156.31
4,302,692 A * 11/1981 Matsumoto ............ H02K 29/14
310/113
(Continued)

FOREIGN PATENT DOCUMENTS

JP  2005-233849 A  9/2005
JP  2009-264941 A  11/2009
(Continued)

OTHER PUBLICATIONS

International Preliminary Report on Patentability dated Apr. 16, 2015 from the International Bureau in counterpart International Application No. PCT/JP2013/075839.
(Continued)

Primary Examiner — Thienvu Tran
Assistant Examiner — Angela Brooks
(74) Attorney, Agent, or Firm — Sughrue Mion, PLLC

(57) ABSTRACT

A sensor unit with a sensing surface molded properly on an outer surface of a sensor receiving part is provided. The sensor unit includes a resin casing formed with an annular fixing member, and a sensor receiving part formed in the casing for receiving a sensor housed. A sensing surface that faces a target object is formed within the sensor receiving part. A resin charging position in molding the casing is set to a position deviated circumferentially from a central position in a width of the sensing surface. In particular, resin is charged into the fixing member from a gate arranged on an extending line of a first through-bore formed in a position corresponding to the charging position.

3 Claims, 8 Drawing Sheets

(51) Int. Cl.
  *G01B 7/30*       (2006.01)
  *B29C 45/14*      (2006.01)
  *G01D 11/24*      (2006.01)
  *G01P 1/02*       (2006.01)
  *G01P 3/487*      (2006.01)
  *G01R 33/00*      (2006.01)
  *G01D 5/245*      (2006.01)
  *B29C 45/27*      (2006.01)
  *B29L 31/00*      (2006.01)
  *B29C 45/00*      (2006.01)

(52) U.S. Cl.
  CPC ............ *G01D 11/245* (2013.01); *G01P 1/026* (2013.01); *G01P 3/487* (2013.01); *G01R 33/0047* (2013.01); *B29C 45/14311* (2013.01); *B29C 45/2708* (2013.01); *B29C 2045/0027* (2013.01); *B29C 2045/14327* (2013.01); *B29L 2031/752* (2013.01); *G01D 5/245* (2013.01)

(56) References Cited

U.S. PATENT DOCUMENTS

| | | | | |
|---|---|---|---|---|
| 4,835,505 | A * | 5/1989 | Hattori | G01P 1/00 335/284 |
| 6,020,805 | A * | 2/2000 | Borja | H04R 9/025 210/222 |
| 7,249,891 | B2 * | 7/2007 | Aoki | F16C 33/586 384/448 |
| 7,400,141 | B2 * | 7/2008 | Taniguchi | G01D 5/2457 29/893.3 |
| 7,423,506 | B2 * | 9/2008 | Terasaki | H01F 7/021 335/281 |
| 8,188,729 | B2 * | 5/2012 | Ito | F16C 33/80 324/173 |
| 2004/0135454 | A1 * | 7/2004 | Takahashi | H02K 1/278 310/156.45 |
| 2005/0104581 | A1 * | 5/2005 | Miyata | F02D 11/106 324/207.25 |
| 2006/0228060 | A1 * | 10/2006 | Inoue | F16C 19/186 384/448 |
| 2007/0177834 | A1 * | 8/2007 | Koyagi | F16C 19/186 384/448 |
| 2009/0045765 | A1 * | 2/2009 | Ichiyama | H02K 21/028 318/538 |
| 2010/0225309 | A1 * | 9/2010 | Takahashi | G01D 5/145 324/207.25 |
| 2011/0127995 | A1 | 6/2011 | Nishikawa et al. | |
| 2013/0258650 | A1 * | 10/2013 | Sharrah | F21V 23/026 362/217.13 |
| 2013/0285650 | A1 * | 10/2013 | Adachi | G01P 3/443 324/207.25 |
| 2014/0053646 | A1 * | 2/2014 | Takasaki | G01D 11/245 73/431 |
| 2016/0146630 | A1 * | 5/2016 | Takahashi | G01D 5/24438 324/207.25 |

FOREIGN PATENT DOCUMENTS

| | | |
|---|---|---|
| JP | 2010-043888 A | 2/2010 |
| JP | 2010-125822 A | 6/2010 |
| WO | 2012/114703 A1 | 8/2012 |

OTHER PUBLICATIONS

International Search Report for PCT/JP2013/075839 dated Nov. 5, 2013.

* cited by examiner

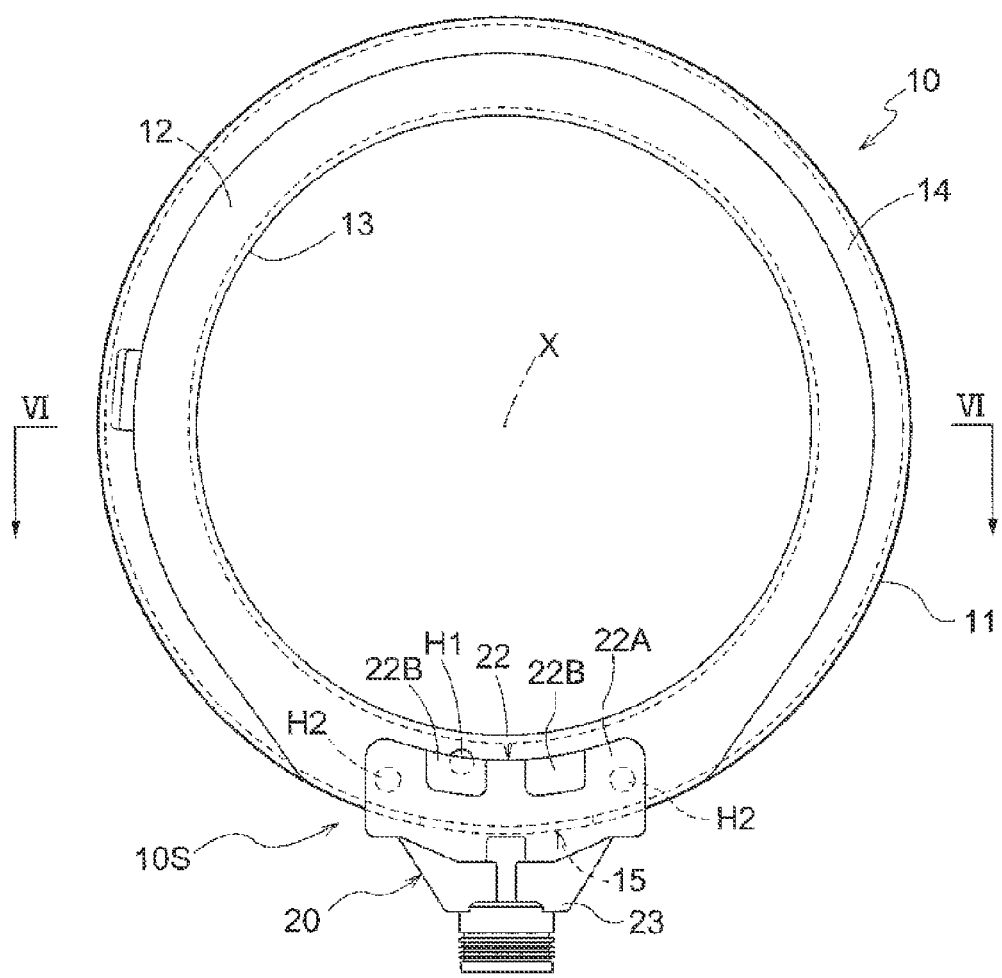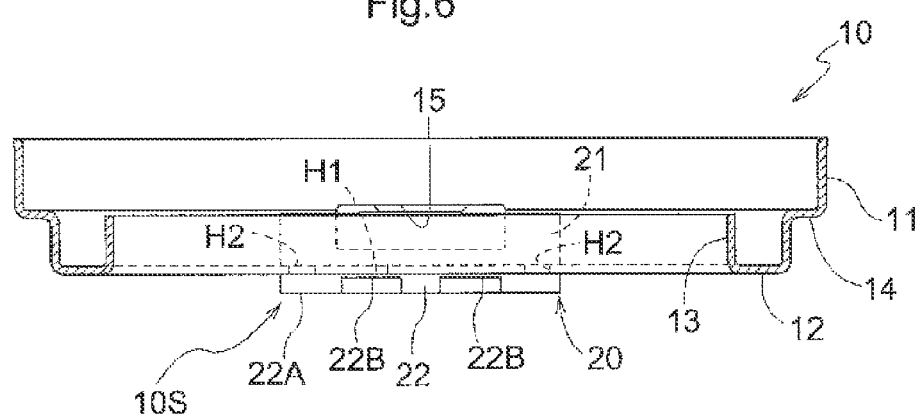

SENSOR UNIT

CROSS REFERENCE TO RELATED APPLICATIONS

This application is a National Stage of International Application No. PCT/JP2013/075839 filed Sep. 25, 2013, claiming priority based on Japanese Patent Application No. 2012-221585 filed Oct. 3, 2012, the contents of all of which are incorporated herein by reference in their entirety.

TECHNICAL FILED

The present invention relates to an improved sensor unit.

BACKGROUND ART

Patent Literature 1 discloses an example of a sensor unit including an annular fixing element ("ring part" in Patent Literature 1), and a sensor element fixed to the fixing element by resin molding. According to the construction disclosed in Patent Literature 1, the sensor element is configured to sense magnetism of a target rotary object rotatable in unison with a rotary shaft, thereby to detect rotating speed of the rotary object.

CITATION LIST

Patent Literature

Patent Literature 1: Japanese Unexamined Patent Application Publication No. 2009-264941

SUMMARY OF INVENTION

With a sensor including a sensor element for sensing magnetism of a magnet disposed in a rotary element thereby to detect rotation of the rotary element, the sensibility is enhanced due to a short distance between the magnet and the sensor element, thereby to achieve error-reduced detection.

Further, with a sensor unit for detecting rotation of a vehicle axle, as disclosed in Patent Literature 1, it is desirable to cause a sensor to be firmly supported to a fixing element, and to form the sensor integrally with the fixing element by resin molding in order to enhance dustproofness and waterproofness of the sensor.

It is also desired in a sensor unit including a sensor receiving part made of resin for housing a sensor to reduce a thickness of a sensing surface opposed to a magnet as much as possible in order to enhance the detecting sensibility.

Meanwhile, if a gate is formed in a position remote from the sensing surface in the unit including the casing integrally formed with the fixing member with a die, molten resin charged from the gate of the die may flow into a space area other than a space area forming the sensing surface first, and then into the space area forming the sensing surface. In such a case, not only a short shot may hinder the resin from flowing with a sufficient amount for forming the sensing surface, but also the resin flows into the space area forming the sensing surface from all the directions to be solidified and may produce a weld line in the sensing surface. Thus, there is room for improvement.

In particular, if the sensor unit with a sensing surface that is short of resin or has a weld line is provided in the vicinity of a vehicle wheel, the resin may crack when components of a snow-melting agent such as calcium chloride sprinkled in a road surface are attached to the unit, which may disadvantageously cause corrosion or insulation.

An object of the present invention is to provide a sensor unit in a rational manner, which molds a sensing surface in an outer surface of a sensor receiving part properly.

A sensor unit according to the present invention includes a resin casing attached to an annular fixing member centering about an axis, and a sensing surface that faces a target object rotating about the axis is formed on an outer surface of the sensor receiving part of the casing, and a resin charging position in molding the casing with a die is set to a position deviated circumferentially from a central position in a width of the sensing surface extending along a circumferential direction around the axis.

With the above arrangement, when molten resin is supplied from the charging position, the resin flows from the charging position into an area forming the sensing surface early. Also, since the charging position is defined in the position deviated from the center of the width of the sensing surface, the charged resin flows from one end of the width of the sensing surface toward the center of the width of the sensing surface to permeate the area forming the sensing surface, and then is fed to the outside. This allows a sufficient amount of resin to be supplied to the area forming the sensing surface and prevents a weld line from being produced in this area.

As a result, the sensor unit provides, in molding, a proper thickness for the sensing surface formed in the outer surface of the sensor receiving part, and prevents a weld line from being produced.

According to the present invention, the casing may include a main casing part having the sensor receiving part and formed on one surface of the fixing member, and an auxiliary casing part formed on the other surface of the fixing member, in which a first through-bore extending through the fixing member from the one surface to the other surface may be formed on an extending line in a resin charging direction in the charging position, and the auxiliary casing part may have a thick portion having a predetermined thickness measuring from an outer wall surface of the fixing member, and a thin portion that is thinner than the thick portion and formed in a position to overlie the first through-bore.

With the above arrangement, the molten resin charged from the charging position flows into the area forming the sensing surface linearly through the first through-bore. Further, part of the resin charged from the charging position flows into a space area forming the auxiliary casing. Since the charging position is defined to overlie the thin portion, resistance is increased when the resin flows into the space area for forming the auxiliary casing. This suppresses the amount of resin flowing into the space for forming the auxiliary casing, which does not decrease the amount of resin passing through the first through-bore.

According to the present invention, the charging position may be set to a position corresponding to a corner of the sensing surface.

With the above arrangement, the molten resin charged from the charging position corresponding to the corner of the sensing surface flows to spread fanwise from the charging position and then to the outside from the area forming the sensing surface. As a result, it is satisfactorily prevented that the resin flows from the outside.

According to the present invention, the sensor receiving part may be formed in a projecting area projecting from a base part of the casing toward the axis, and the charging position may be defined in a position corresponding to a corner of the sensing surface in a position displaced toward the axis, the sensing surface being formed in the projecting area, and a connecting part may be formed adjacent to the sensing surface to continue from the base part and separated from an end portion of the base part projecting toward the axis, the connecting part being arranged side by side with a position where the sensing surface is formed.

With the above arrangement, the molten resin charged from the charging position fills the area forming the sensing surface and then flows toward a space area forming the base part, and further into a space area forming the connecting part from the space area forming the base part. As a result, the molten resin charged from the charging position is prevented from directly flowing toward the space area forming the connecting part, which allows a sufficient amount of resin to be supplied to the portion forming the sensing surface.

BRIEF DESCRIPTION OF DRAWINGS

FIG. 5 is a plan view of the fixing member including the casing formed therewith;
FIG. 6 is a sectional view taken on line VI-VI in FIG. 5.

DESCRIPTION OF EMBODIMENTS

Figure 1:
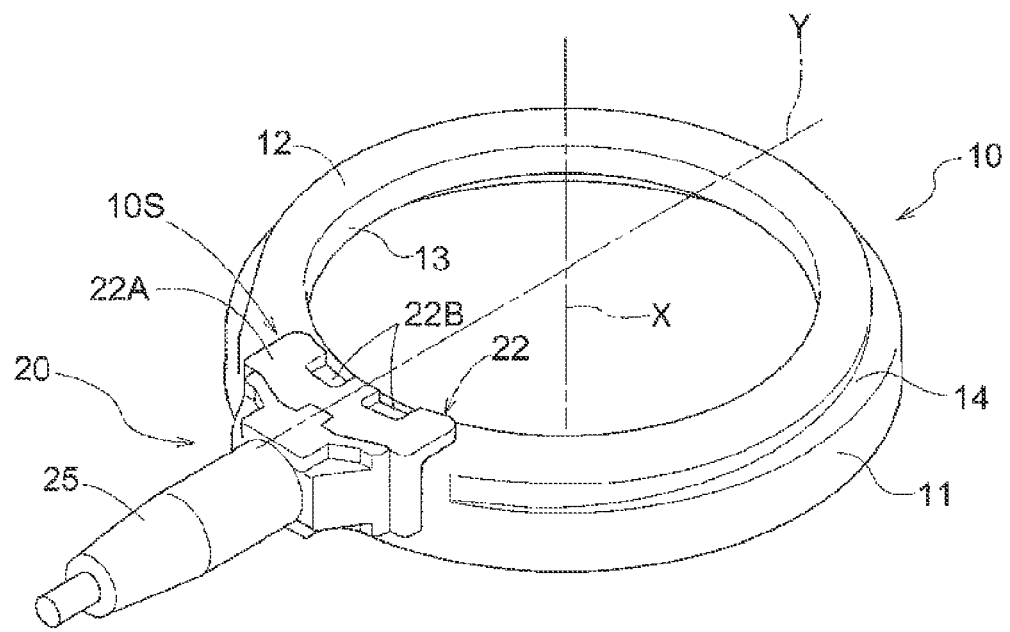
FIG. 1 is a perspective view of a sensor unit.
Figure 2:
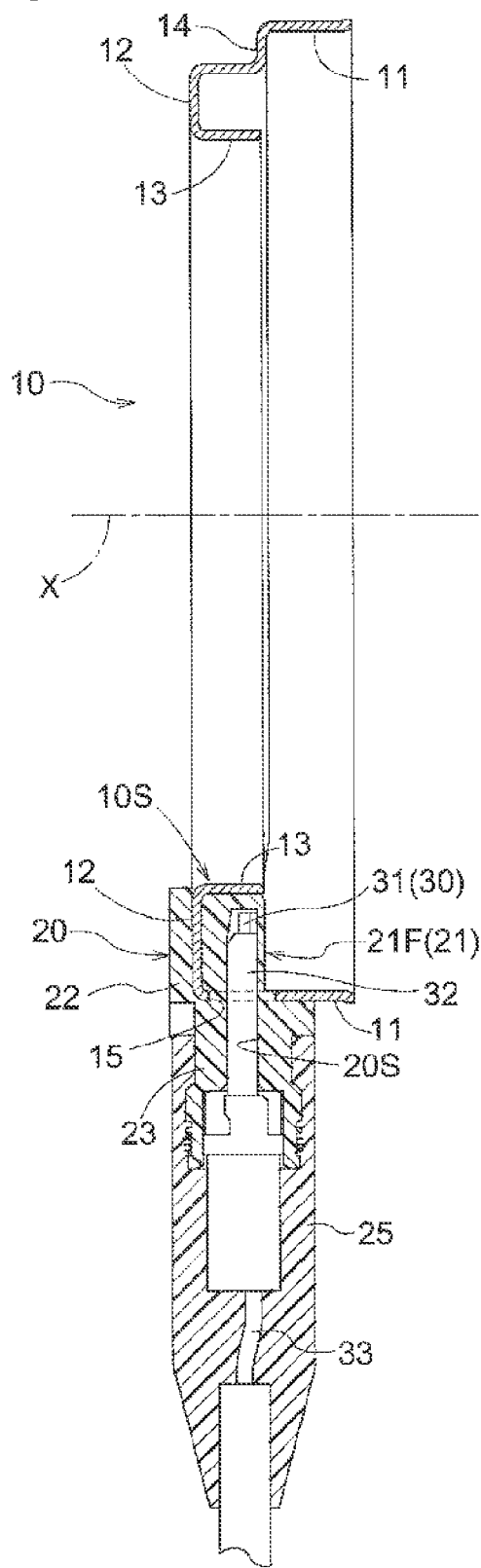
FIG. 2 is a sectional view of the sensor unit.

Embodiments of the present invention will be described hereinafter in reference to the accompanying drawings.
[Sensor Unit]
Referring to FIGS. 1 and 2, a sensor unit includes an annular fixing member 10 centering around an axis X, a casing 20 formed integrally with the fixing member 10 by resin molding, and a sensor 30 housed in a sensor receiving part 20S of the casing 20.

The sensor unit is used to detect rotation of a rotary shaft such as a vehicle axel, and has a magnet-sensitive element acting as the sensor 30, including a Hall element, a magnetoresistive effect element or the like, configured to detect magnetism of a (permanent) magnet rotatable in unison with the axle (not shown).

Referring to FIGS. 1 to 10, the fixing member 10 has a cylindrical outer wall 11 formed in a tubular shape centering around the axis X, an end wall 12 extending from one end of the cylindrical outer wall 11 to be perpendicular to the axis X, and a cylindrical inner wall 13 formed in a tubular shape centering around the axis X in an inner circumferential side of the end wall 12. Those walls are formed as one-piece and made of metal material such as steel, stainless steel or the like. An intermediate wall 14 is formed in part of an intermediate portion between the cylindrical outer wall 11 and the end wall 12 to be perpendicular to the axis.

A sensor forming section 10S is defined in a portion of the fixing member 10 having no intermediate wall 14, and includes an outer wall opening 15 formed in the cylindrical outer wall 11, and a single through-bore H1 and a pair of through-bores H2. The through-bores H1 and H2 extend through the end wall 12 parallel to the axis X.

The casing 20 includes a main casing component 21 extending over an inner surface of the cylindrical outer wall 11 and an inner surface of the end wall 12 of the fixing member 10, an auxiliary casing component 22 formed on an outer surface of the end wall 12, and a projecting casing part 23 formed on an outer surface of the cylindrical outer wall 11. In this construction, while the region extending over the inner surface of the cylindrical outer wall 11 and the inner surface of the end wall 12 of the fixing member 10 represents a typical example of one surface of the fixing member 10, the outer surface of the end wall 12 represents a typical example of the other surface of the fixing member 10.

The main casing component 21, the auxiliary casing component 22, and the projecting casing part 23 are formed as one-piece and made of resin. The sensor receiving part 20S is formed as a hole, which is a cavity extending over the projecting casing part 23 and the main casing part 21 along a radial direction of the fixing member 10. The sensor receiving part 20S is defined to pass through the outer wall opening 15.

The sensor 30 has a sensor body 31 acting as the magnet-sensitive element, and a shaft portion 32 connected to the sensor body 31. A cable 33 is led out from an end of the shaft portion 32. The sensor 30 is housed in the sensor receiving part 20S. A protection member 25 is provided to cover the outer surface of the projecting casing part 23.

In the following descriptions, while a circumferential direction centering about the axis X of the fixing member 10 is defined as a width direction of the casing 20, a direction extending along the axis X is defined as a thickness direction.

Figure 8:
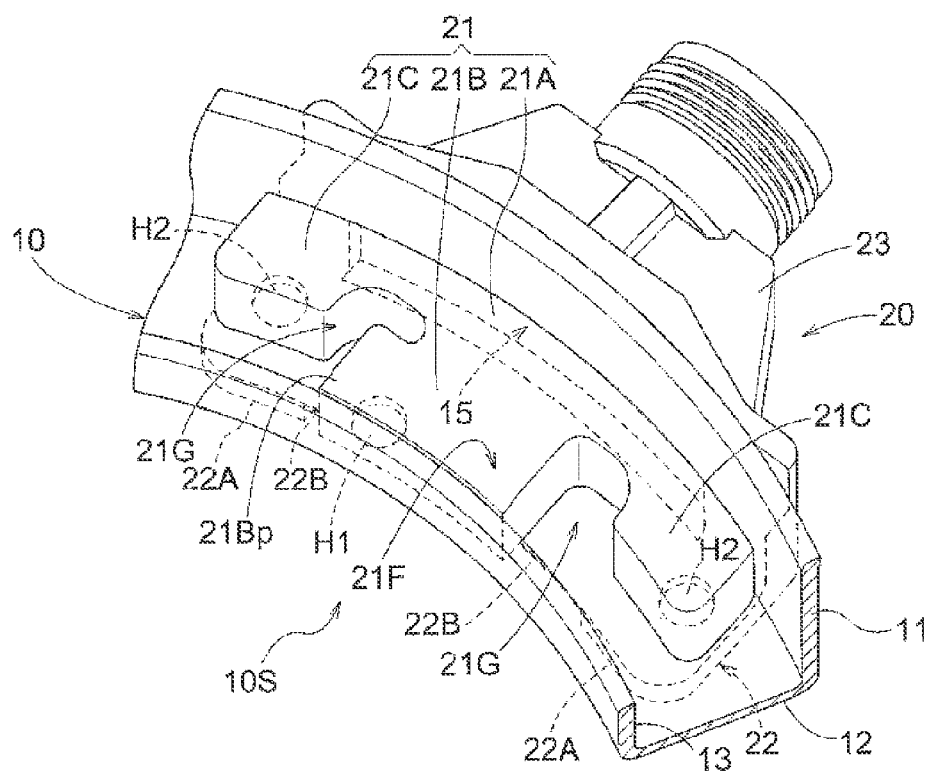
FIG. 8 is a partially cutaway perspective view of the portion where the casing is formed as seen from an inner surface side.
Figure 9:
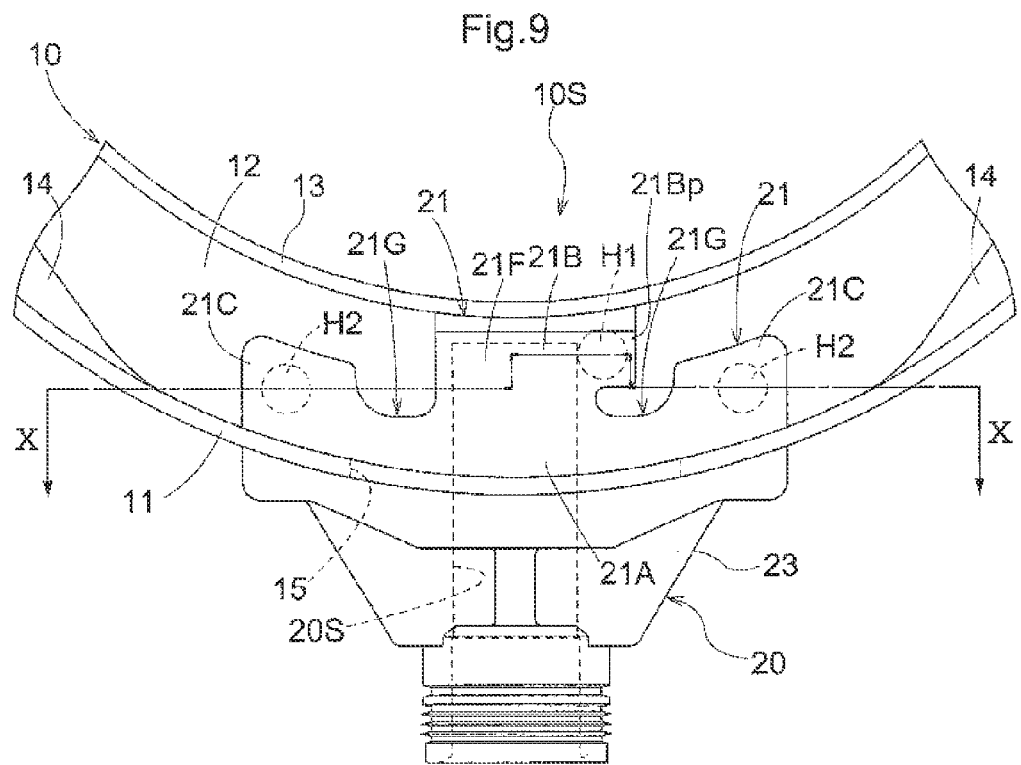
FIG. 9 is a view of the portion where the casing is formed as seen from the inner surface side.

Referring to FIGS. 8 and 9, the main casing component 21 has a base part 21A (an example of a base) that is in tight contact with the cylindrical outer wall 11; a part in the vicinity of the projecting casing part 23), and a projecting part 21B continuing from the base part 21A in a central area of the base part 21A in the width direction and projecting toward the axis X. Adjacent to the projecting part 21B, a pair of connecting parts 21C are formed on both sides of the projecting part 21B to continue from the base part 21A, with projecting sides thereof being separated from the projecting part 21B. This arrangement provides depressions 21G opened toward the axis X between the projecting part 21B and the connecting part 21C.

In particular, the sensor receiving part 20S is formed in the interior of the projecting part 21B. A flat sensing surface 21F is formed on an outer surface of the projecting part 21B. A distance (thickness) between the sensing surface 21F and an inner surface of the sensor receiving part 20S is set to about 0.7 mm.

Figure 7:
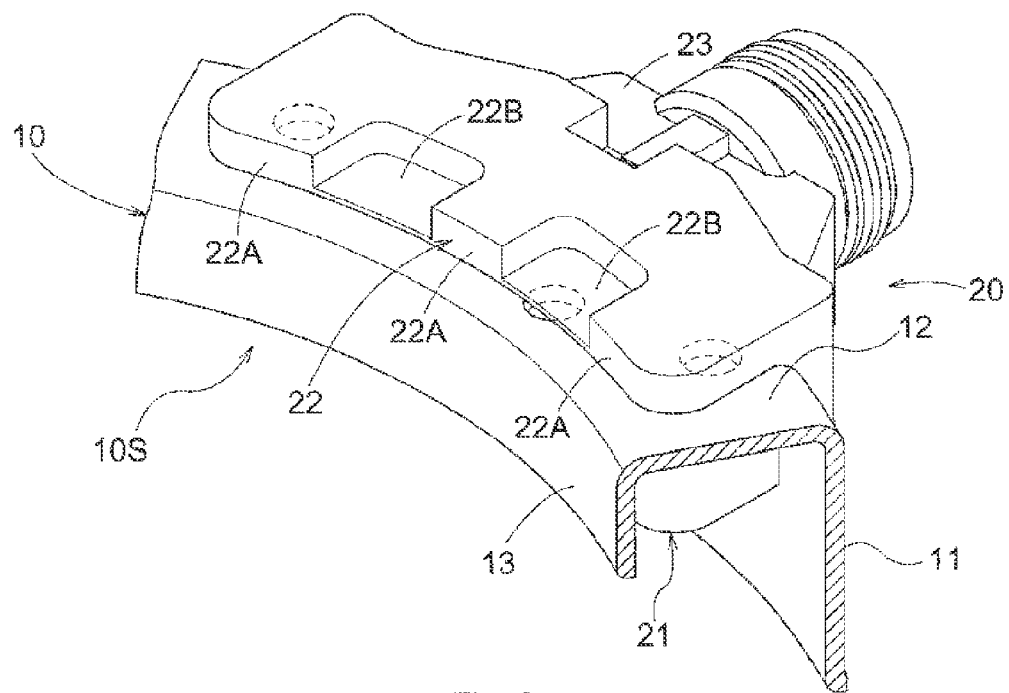
FIG. 7 is a partially cutaway perspective view of a portion where the casing is formed as seen from an outer surface side.
Figure 10:
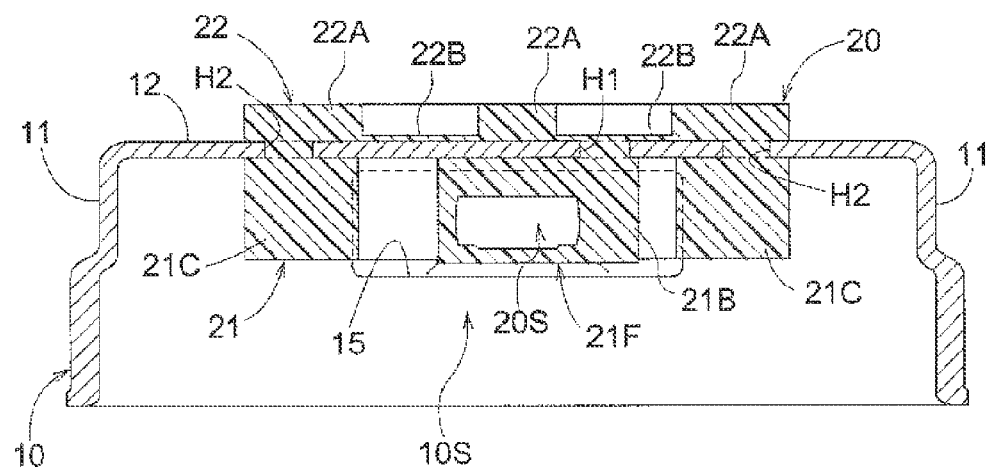
FIG. 10 is a sectional view taken on line X-X in FIG. 9.

The auxiliary casing component 22 has the same dimension as the main casing component 21 in the width direction and lies over the main casing component 21 in the thickness direction. Referring to FIGS. 5, 7 and 10, the auxiliary casing component 22 includes a thick portion 22A having a predetermined thickness in the vicinity of the projecting casing 23, and two thin portions 22B, which are thinner than the thick portion 22A, formed on both sides of the central portion of the auxiliary casing component 22 in the width direction near the axis X.

With the above construction, while the thick portion 22A is provided in the central portion in the width direction and opposite end portions of the auxiliary casing component 22 near the axis X, the thin portions 22B are each provided between the thick portions. It should be noted that the thicknesses of the thick portion 22A and the thin portion 22B are dimensions measuring from the top surface of the end wall 12 of the fixing member 10.

Further, as shown in FIG. 9, an extension 21Bp (portion corresponding to a corner of the sensing surface 21F) is formed to extend in the width direction from one side of a projecting end portion of the sensing surface 21F near the axis X. The first through-bore H1 is formed in a boundary between the extension 21Bp and the sensing surface 21F as viewed along the axis X. Further, the first through-bore H1 is formed to lie over the thin portion 22B of the auxiliary casing component 22. Since the projecting end portion of the sensing surface 21F has two corners having substantially the right angles as viewed along the axis X, the extension 21Bp is formed by extending only one of the two corners of the projecting part of the sensing surface 21F in the width direction (circumferential direction centering about the axis X).

The above construction allows the cylindrical outer wall 11 of the sensor unit to firmly fit on a fixing element such as an outer race of a ball bearing rotatably supporting the axle, thereby to arrange the sensing surface 21F of the main casing component 21 of the sensor unit in the vicinity of a rotating area of a magnet rotatable in unison with the axle, and allows the magnet-sensitive element to detect magnetism of the (permanent) magnet rotatable in unison with the axle.

[Method of Manufacturing Sensor Unit]

Figure 3:
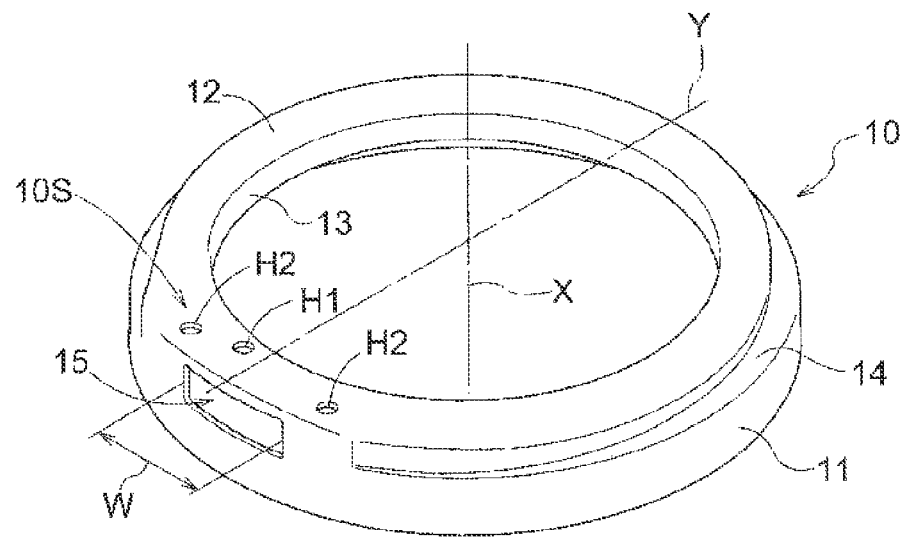
FIG. 3 is a perspective view of a fixing member.
Figure 4:
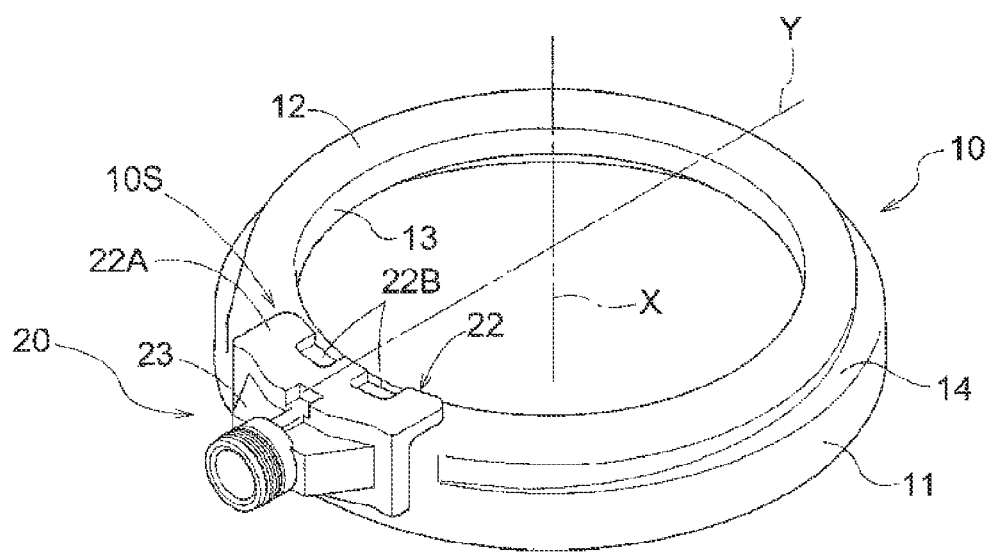
FIG. 4 is a perspective view of the fixing member including a casing formed therewith.

The sensor unit is manufactured by forming the outer wall opening 15 in the cylindrical outer wall 11 positioned in the sensor forming section 10S of the fixing member 10, and forming the single through-bore H1 and the pair of through-bores H2 extending through the end wall 12 of the sensor forming section 10S parallel to the axis X (see FIG. 3).

The first through-bore H1 is formed in the end wall 12 in the vicinity of the cylindrical inner wall 13 to deviate in the circumferential direction from an imaginary center line Y passing through a central position of an opening width W of the outer wall opening 15 and the axis X. The second through-bores H2 are formed in the end wall 12 to be symmetric about the imaginary center line Y passing through the central position of the opening width W of the outer wall opening 15 and the axis X. The sensor receiving part 20S is formed to extend along the imaginary center line Y.

Figure 11:
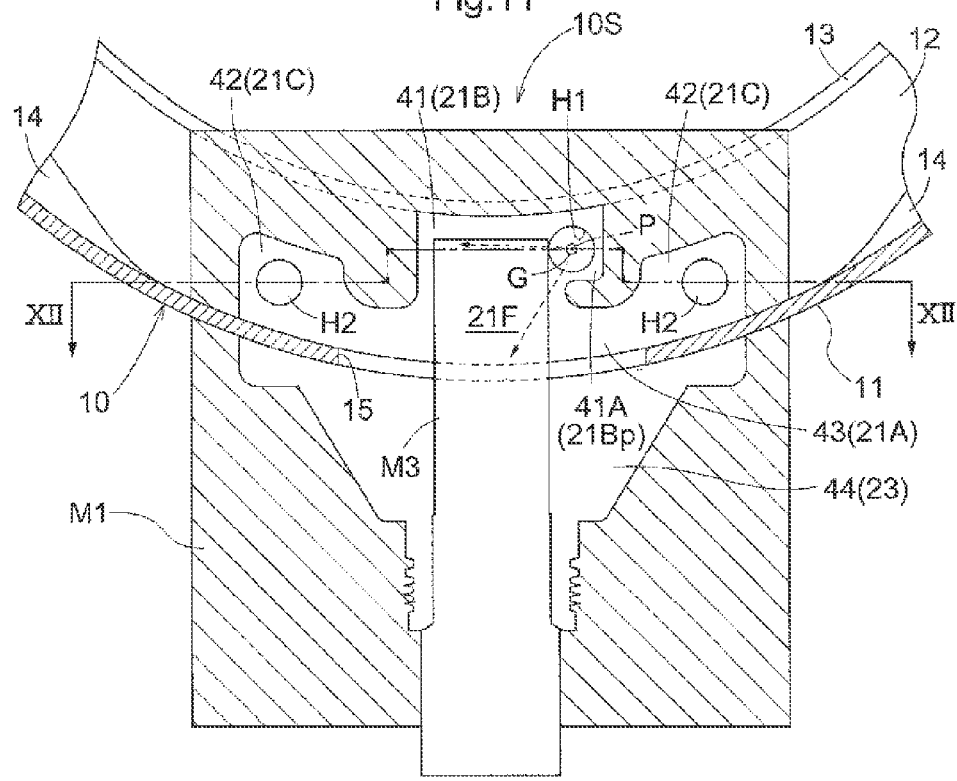
FIG. 11 is a sectional view of the fixing member with dies arranged thereon.
Figure 12:
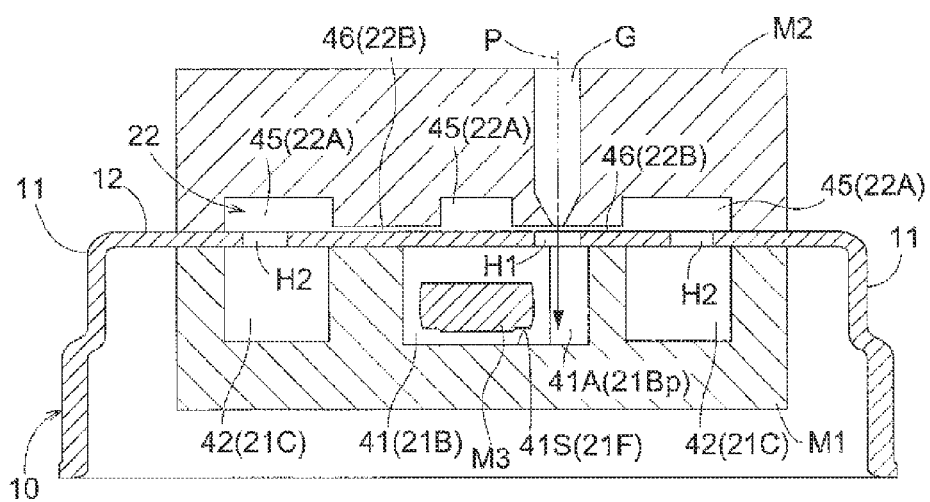
FIG. 12 is a sectional view taken on line XII-XII in FIG. 11.

Next, as shown in FIGS. 11 and 12, a first die M1 is disposed to be in tight contact with a region of the fixing member 10 extending over the inner surface side of the cylindrical outer wall 11 and the inner surface side of the end wall 12 (one surface of the fixing member 10), as well as the outer surface of the cylindrical outer wall 11. In the meantime, a second die M2 is disposed to be in tight contact with a region extending over the outer surface side of the end wall 12 (the other surface of the fixing member 10) and the cylindrical outer wall 11. Further, a core element M3 is inserted an inner space defined between the first die M1 and the second die M2 to form the sensor receiving part 20S.

The arrangement of the first die M1 and the second die M2 provides a main cavity portion between the first die M1 and the fixing member 10 and an auxiliary cavity portion between the second die M2 and the fixing member 10. Further, a projecting cavity 44 for forming the projecting case part 23 is defined between the first die M1 and the second die M2 in the outside of the cylindrical outer wall 11.

The cavity portion defined in a region including the first through-bore H1 and the second through-bores H2 includes, as the main cavity portion, a central space area 41 for forming the projecting part 21B, side space areas 42 for forming the pair of connecting parts 21C, and base space areas 43 continuing from the central space area and the side space areas. The first die has a central molding surface 41S in an inner wall thereof opposed to the end wall 12 to mold the sensing surface 21F described above (see FIG. 10).

Further, a supplementary charging space area 41A for forming the extension 12Bp is defined in a projecting side end of the central space area 41 to bulge widthwise from the central space area 41. The first through-bore H1 is positioned in the boundary between the supplementary charging space area 41A and the central space area 41.

The core element M3 described above is housed in the central space area 41, and a distance between the central molding surface 41S and the core element M3 is set to about 0.7 mm.

In addition, the auxiliary cavity portion includes three thick portion space areas 45 for molding the thick portions 22A and a pair of thin portion space areas 46 for molding the thin portions 22B. The thick portion space areas 45 positioned opposite to each other in the width direction communicate with the side space areas 42 described above through the second through-bores H2.

A gate G is formed in a portion of the second die M2 communicating with one of the pair of thin portion space areas 46, which acts as a charging position for charging molten resin. The first through-bore H1 is arranged on an extending line in the resin-charging direction in the gate G. As described above, the first through-bore H1 is arranged to communicate with the boundary between the central space area 41 and the supplementary charging space area 41A.

Further, an imaginary charging line P passing through the center of the gate G is aligned with the center of the first through-bore H1. Meanwhile, the supplementary charging space area 41A, the first through-bore H1 and the gate G are arranged so as not to overlie the core element M3 as viewed in the direction along the axis X.

With the above arrangement, when heated, molten resin is charged from the gate G of the second die M2, most of the resin flows along the charging line P and passes through the first through-bore H1 to flow into the supplementary charging space area 41A of the central space area 41 of the main cavity portion. The resin reaches a bottom end of the supplementary charging space area 41A and then flows along the central molding surface 41S of the central space area 41. As a result, a sufficient quantity of resin can be charged between the central molding space area 41S and the core element M3.

When the molten resin is charged, air that is present in the central space area 41 flows into the pair of side space areas 42 and then into the second die M2 from each of the side space areas 42 through the second through-bores H2. As a result, the resin can flow satisfactorily within the main casing component 21.

In particular, the molten resin flows to spread fanwise from the supplementary charging space area 41A (one corner) of the central space area 41 and fills the central space area 41 to the other corner thereof. Further, the resin flows into the base space area 43 from the central space area 41, and then into the pair of side space areas 42 from the base area 43, thereby to permeate through those areas. Since the first die M1 is separated in a region between the central space area 41 and the pair of side space areas 42 near the axis X, the resin supplied to the corners of the central space area 41 is prevented from flowing linearly into the side space areas 42. This allows a sufficient quantity of resin to constantly fill the central space area 41, which prevents nearly solidified resin from disadvantageously flowing back to the central space area 41 from the side space areas 42, for example. This also can avoid producing a weld line.

As the molten resin in the second die M2 is charged from the gate G and part of the resin flows into the thin portion space area 46, the flow of the resin in the thin portion space area 46 is restrained because of a large flow resistance in the thin portion space area 46.

The molten resin supplied to the central space area 41 flows from the base space area 43 to the outer wall opening 15, and then into the projecting cavity 44 for forming the projecting case part 23 from the outer wall opening 15. The resin further flows into the auxiliary cavity portion of the second die M2 along the outer surface of the cylindrical outer wall 11, and then into the thick portion space areas 45 and the thin portion space areas 46 to permeate through those space areas.

When the molten resin flows in this manner, the resin coming into the pair of side space areas 42 flows into the thick portion space areas 45 through the second through-bores H2. Such a flow also allows the resin to fill the thick portion space areas 45 and the thin portion space areas 46 continuing from the thick portion space areas.

While thermoplastic material such as nylon that is molten by heating can be used as the rein, material other than nylon also can be used.

Figure 13:
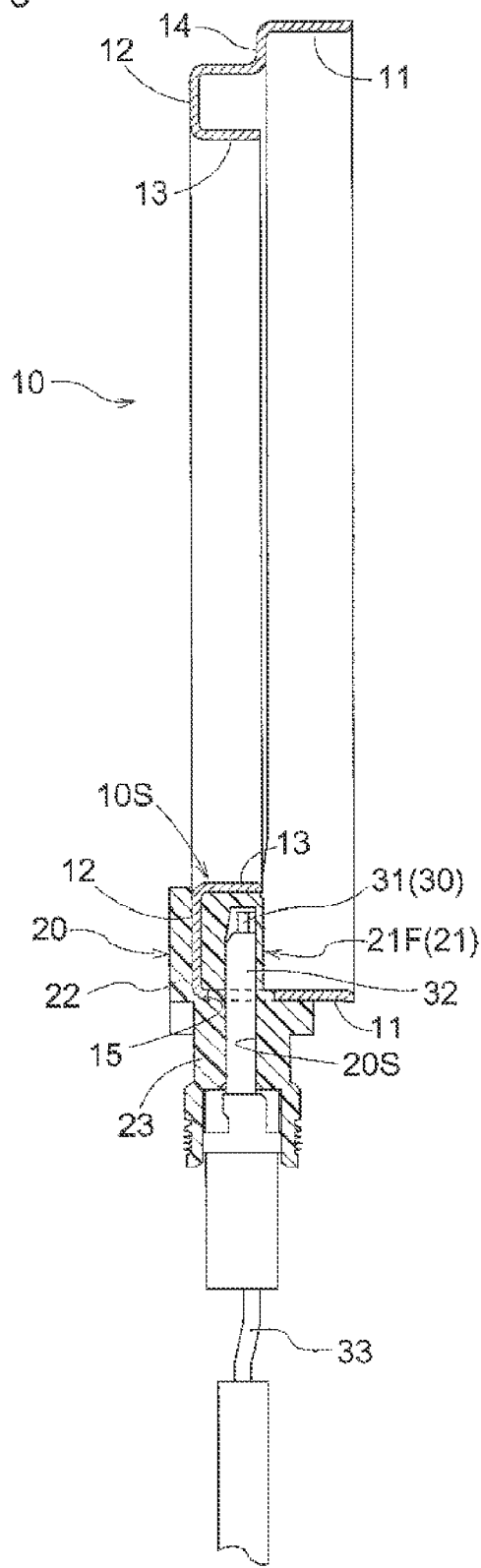
FIG. 13 is a sectional view of the fixing member including the casing formed therewith and a sensor inserted into the casing.

The first die M1 and the second die M2 are removed and the core element M3 is withdrawn after the resin is charged, the casing 20 is formed integrally with the fixing member 10 as illustrated in FIG. 13. Then, the sensor 30 is inserted into the sensor receiving part 20S and the protection member 25 is formed with die molding to provide the sensor unit.

According to the present invention, the resin can be directly charged into the main cavity portion of the first die M1 through the first through-bore H1 formed in the end wall 12 from the gate G formed in the second die M2 disposed in the outer surface side of the end wall 12. Thus, the resin charging passage can be simplified, compared with a unit in which the gate G is formed in the first die M1.

Alternative Embodiments

The unit according to the present invention may be modified in various ways.

[a] The extension 21Bp for charging the resin into the projecting part 21B of the main casing component 21 is dispensable. Instead, the first through-bore H1 and the gate G may be provided to overlie a projecting end of the projecting part 21B. In such a case, the first through-bore H1 is desirably provided in the vicinity of a corner of the projecting part 21B in order to prevent a weld line from being produced.

[b] Instead of forming the sensor receiving part 20S as a space, the sensor unit may be formed by die molding with which the sensor 30 is inserted into the sensor receiving part 20S. When the sensor unit is provided in this manner, it is also possible to suppress increase in thickness of the sensing surface 21F and prevent a weld line from being produced in this area.

[c] In the above embodiment, the first die M1, the second die M2 and the core element M3 are used to mold the casing 20. Additionally, a supplementary mold may be disposed in the outside of the fixing member 10 in order to mold the projecting casing part 23 of the casing 20. By using the supplementary mold for forming the projecting casing part 23, it is possible to handle a case even when the projecting casing part 23 has a complicated outer surface configuration.

INDUSTRIAL APPLICABILITY

The present invention is applicable to sensor units including an annular fixing member and a casing integrally formed with the fixing member by die molding.

The invention claimed is:

1. A sensor unit comprising a resin casing attached to an annular fixing member centering about an axis, and a sensor housed in a sensor receiving part of the casing,
   wherein a sensing surface that faces a target object rotating about the axis is formed on an outer surface of the sensor receiving part of the casing,
   wherein a resin charging position in molding the casing with a die is set to a position deviated circumferentially from a central position in a width of the sensing surface extending along a circumferential direction around the axis,
   wherein the casing includes a main casing part having the sensor receiving part and formed on one surface of the fixing member, and an auxiliary casing part formed on the other surface of the fixing member,
   wherein a first through-bore extending through the fixing member from the one surface to the other surface is formed on an extending line in a resin charging direction in the charging position, and
   wherein the auxiliary casing part has a thick portion having a predetermined thickness measuring from an outer wall surface of the fixing member, and a thin portion that is thinner than the thick portion and formed in a position to overlie the first through-bore.

2. The sensor unit according to claim 1,
   wherein the charging position is set to a position corresponding to a corner of the sensing surface.

3. The sensor unit according to claim 2,
   wherein the sensor receiving part is formed in a projecting area projecting from a base part of the casing toward the axis, and the charging position is defined in a position corresponding to a corner of the sensing surface in a position displaced toward the axis, the sensing surface being formed in the projecting area, and
   wherein a connecting part is formed adjacent to the sensing surface to continue from the base part and separated from an end portion of the base part projecting toward the axis, the connecting part being arranged side by side with a position where the sensing surface is formed.

* * * * *